United States Patent
Matsumoto et al.

(10) Patent No.: US 10,222,413 B2
(45) Date of Patent: Mar. 5, 2019

(54) IC HANDLER

(71) Applicant: HAPPYJAPAN, INC., Yamagata-shi (JP)

(72) Inventors: Shouhei Matsumoto, Yamagata (JP); Mitsuo Koizumi, Yamagata (JP); Fumiaki Togashi, Yamagata (JP); Satoshi Ueno, Yamagata (JP); Keitaro Harada, Yamagata (JP); Masayoshi Yokoo, Yamagata (JP)

(73) Assignee: HappyJapan Inc., Yamagata-shi, Yamagata (JP)

( * ) Notice: Subject to any disclaimer, the term of this patent is extended or adjusted under 35 U.S.C. 154(b) by 0 days.

(21) Appl. No.: 15/101,386

(22) PCT Filed: Dec. 3, 2013

(86) PCT No.: PCT/JP2013/082483
§ 371 (c)(1),
(2) Date: Jun. 2, 2016

(87) PCT Pub. No.: WO2015/083238
PCT Pub. Date: Jun. 11, 2015

(65) Prior Publication Data
US 2016/0356843 A1   Dec. 8, 2016

(51) Int. Cl.
*G01R 31/28*   (2006.01)
*G01R 31/308*   (2006.01)

(52) U.S. Cl.
CPC ..... *G01R 31/2891* (2013.01); *G01R 31/2887* (2013.01); *G01R 31/2893* (2013.01); *G01R 31/308* (2013.01)

(58) Field of Classification Search
CPC ............ G01R 31/2891; G01R 31/2887; G01R 31/2893; G01R 31/308; G01R 31/01;
(Continued)

(56) References Cited

U.S. PATENT DOCUMENTS 6,259,247 B1 * 7/2001 Bannai .................. G01R 31/01
324/750.03
8,542,029 B1 * 9/2013 Mardi .............. G05B 19/41875
324/757.01
(Continued)

FOREIGN PATENT DOCUMENTS

JP   H05-304200 A   11/1993
JP   08-35823   *   2/1996
(Continued)

OTHER PUBLICATIONS

English machine translation of Takagi et al. JPH11281708.*
(Continued)

*Primary Examiner* — Lee Rodak
(74) *Attorney, Agent, or Firm* — Knobbe, Martens, Olson & Bear, LLP

(57) ABSTRACT

An IC handler (4) of the present invention transfers an IC device (D) to a test head (2). The test head (2) is provided with a socket (3), which has a placing surface (3a) having the IC device (D) placed thereon, and which attaches the IC device (D) placed on the placing surface (3a) to the test head (2). The IC handler (4) is provided with a non-contact displacement meter (71) that is disposed by being spaced apart from the socket (3) in the direction perpendicular to the placing surface (3a). The non-contact displacement meter (71) measures a distance from the non-contact displacement meter (71) to the IC device (D) placed on the placing surface (3a) by emitting a laser beam toward the placing surface (3a) of the socket (3).

5 Claims, 6 Drawing Sheets

(58) Field of Classification Search
CPC ............ G01R 31/2874; G01R 31/2851; G01R 31/2867; G01R 31/2863; G01R 31/2875; G01R 31/2884; G01R 31/2889; G01R 31/31905; G01R 1/0441; G01R 1/0483; H01L 2924/00014; H01L 2924/00; H01L 2924/0002; H01L 2924/12042

See application file for complete search history.

(56) References Cited

U.S. PATENT DOCUMENTS

| | | | | |
|---|---|---|---|---|
| 2002/0079468 A1* | 6/2002 | Takeuchi | ............... | G01R 31/01 250/559.4 |
| 2009/0127068 A1* | 5/2009 | Ikeda | ................ | G01R 31/2891 198/341.01 |
| 2010/0104404 A1* | 4/2010 | Yokoo | ................ | G01R 31/2893 414/226.01 |

FOREIGN PATENT DOCUMENTS

| | | | |
|---|---|---|---|
| JP | H0974128 | * | 3/1997 |
| JP | H11281708 | * | 10/1999 |
| JP | 2002-196040 A | | 7/2002 |
| JP | 2009-145153 A | | 7/2009 |
| JP | 2009145153 A | * | 7/2009 |

OTHER PUBLICATIONS

English machine translation of Shoji JPH0974128.*
English Machine Translation of Kutanda, JP 08-35823.*
English machine translation of Hanba JP 2009145153.*

* cited by examiner

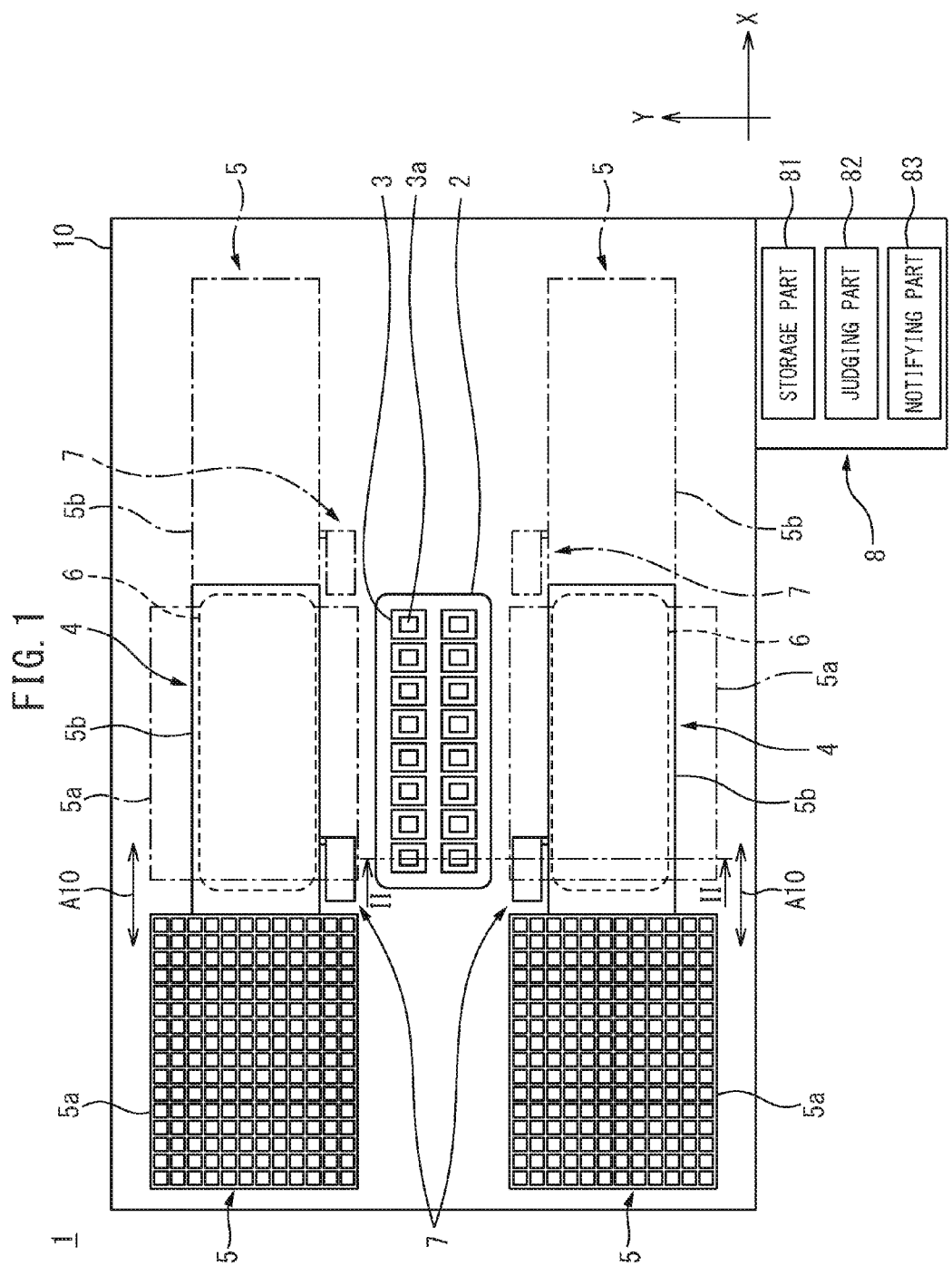

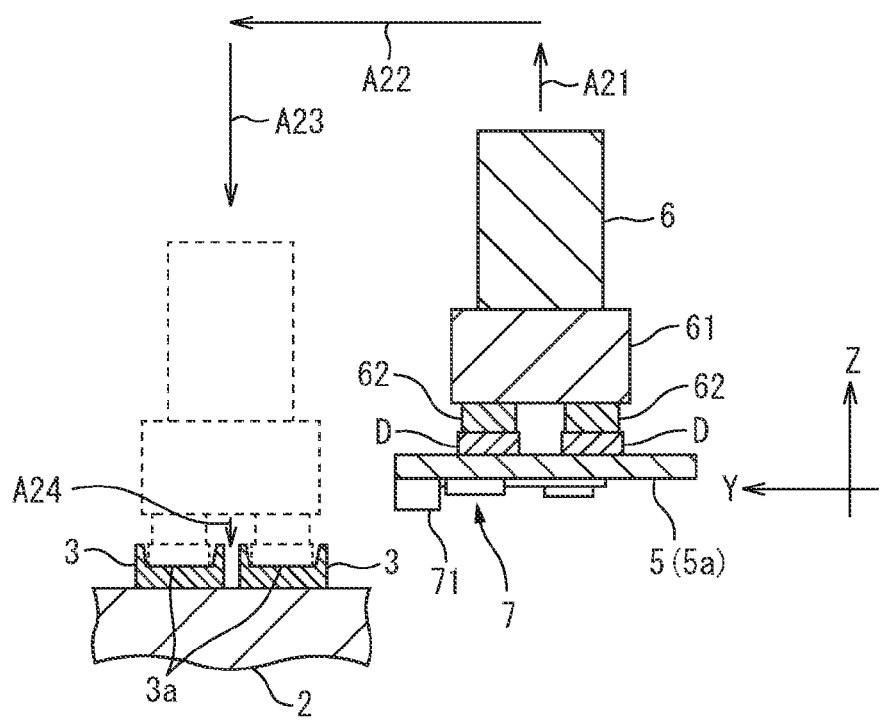
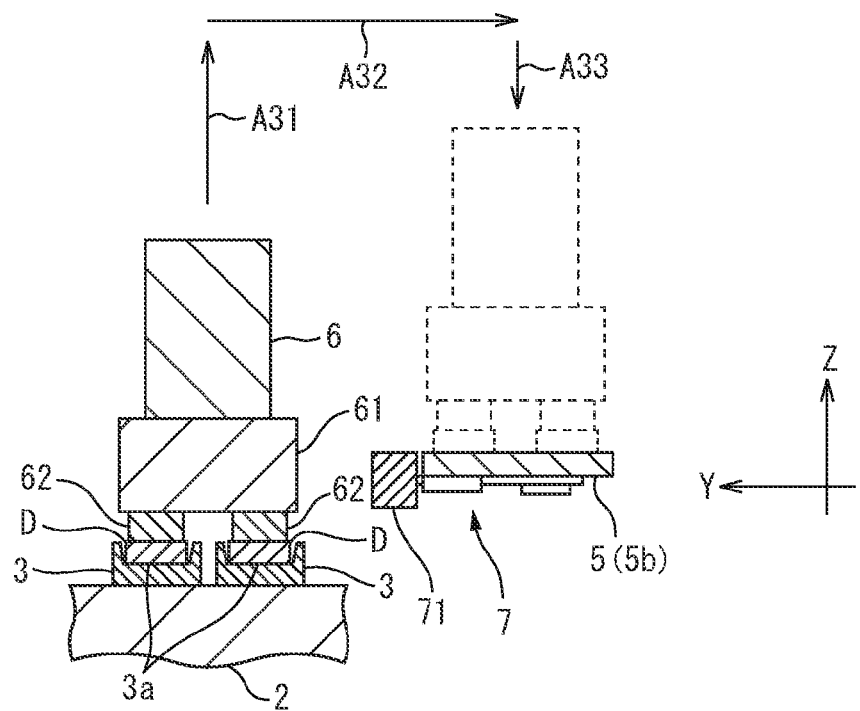

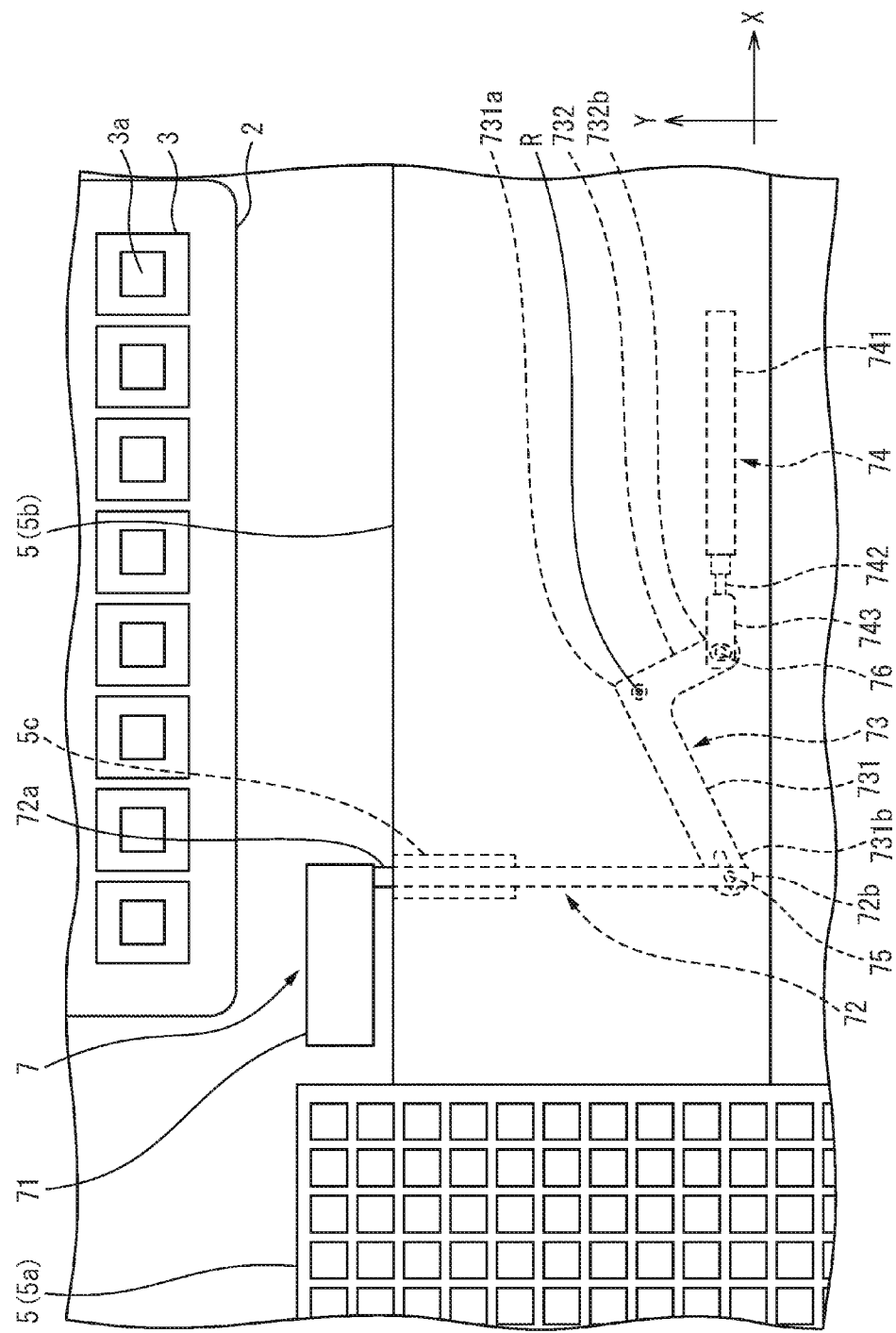

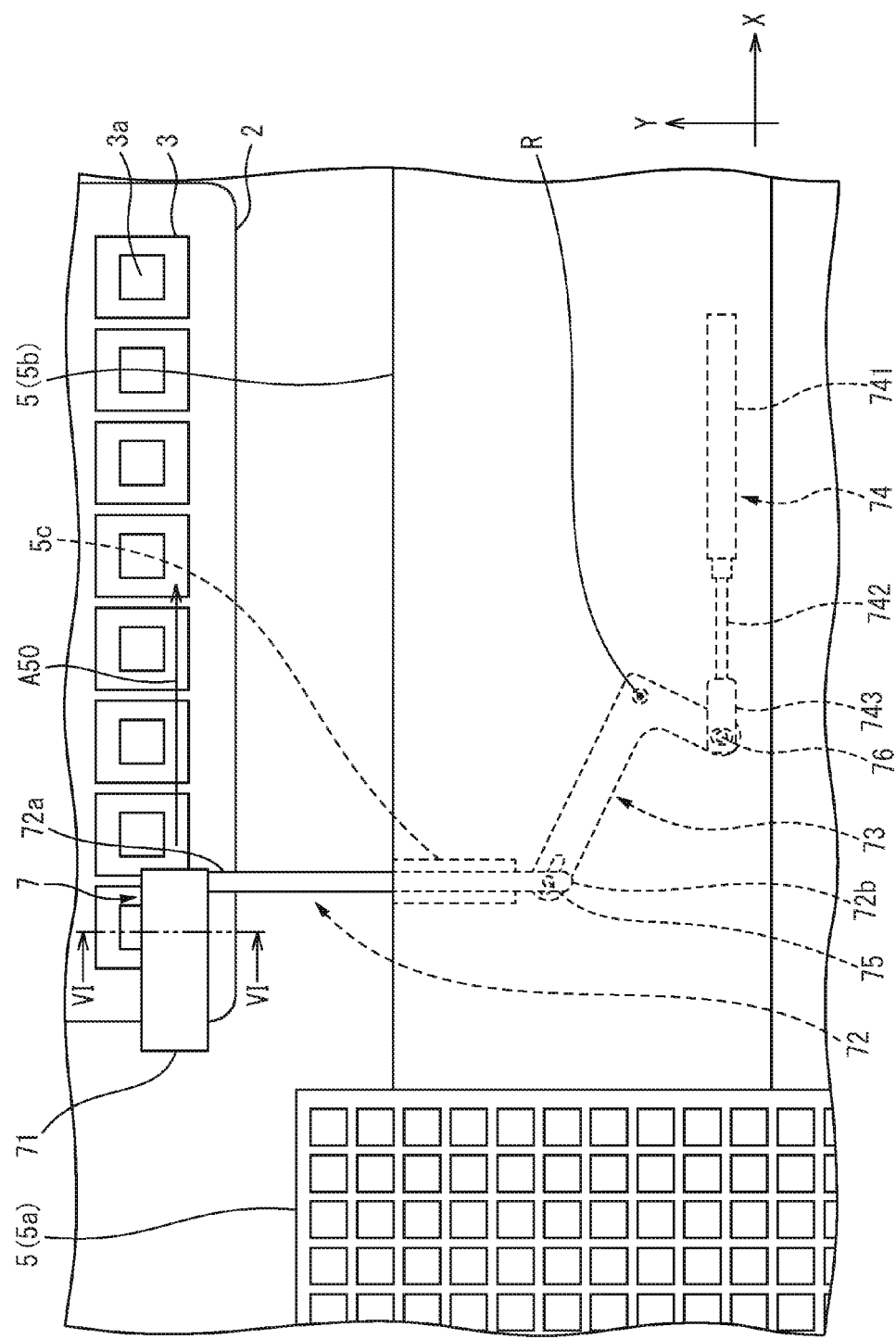

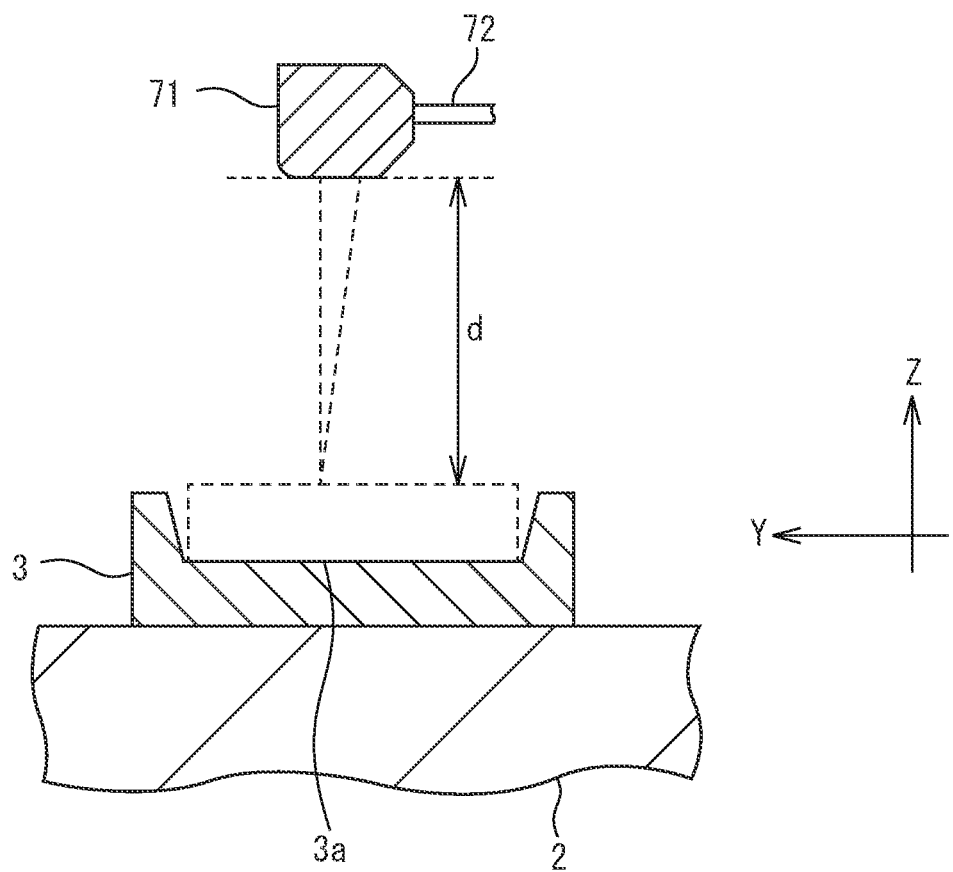

IC HANDLER

TECHNICAL FIELD

The present invention relates to an IC handler for conveying IC devices to a test head for testing IC devices.

BACKGROUND ART

In the process of production of IC devices, a test apparatus for performing power-up tests on IC devices is referred to as an "IC tester". Further, a conveyor apparatus for conveying IC devices for power-up tests by an IC tester is referred to as an IC handler. An IC tester is designed to push IC devices attached to a test head through test sockets against the test head so as to run current through the IC devices. A device for pushing IC devices in the sockets in this way is called a "contact head". In recent IC handlers, the contact head is attached to a robot arm operating so as to insert the IC devices to the sockets.

In this regard, if an IC device inserted in a test socket is not ejected from the socket for some reason or another and is left there, a newly inserted IC device will be stacked over the IC device remaining in the socket. Such a situation can occur if, for example, a worker inserts a dummy device for measurement of resistance in a socket for inspection of the test head, then forgets to eject the dummy device from the socket. If two IC devices are stacked in a socket, the IC device remaining in the socket continues to electrically contact the test head, so it is no longer possible to obtain accurate test results of the newly inserted IC device. Further, if the IC devices inserted stacked in the socket are pushed by the contact head, these IC devices or the contact head may also be damaged. Therefore, a technique suitably preventing a state where two IC devices are loaded stacked in a test socket has been considered necessary. Such a state will be referred to below as a "double stacked state" of IC devices 2.

In relation to this, PLT 1 discloses the art of placing a fiber sensor in a socket for firing a light beam cutting across the socket and judging if an IC device remains in the socket in accordance with whether the light beam of the fiber sensor is interrupted. Further, PLT 2 discloses the art of placing a line sensor or area sensor or other imaging device above a socket and analyzing image data of the socket obtained at the imaging device to judge if an IC device remains in the socket. More specifically, PLT 2 discloses to compare reference data prepared in advance for each type of socket and image data obtained in the imaging device to thereby judge if an IC device remains in the socket.

However, according to the simplified technique using a fiber sensor such as PLT 1, when the IC device under test is a thin type (for example, when the thickness of the IC device is 0.5 mm or less), sometimes it is not possible to accurately detect the IC device remaining in the socket. Furthermore, according to the technique of PLT 1, it is necessary to precisely position the light axis of the fiber sensor with respect to the socket each time the dimensions of the IC device are changed, so the load of the preparatory work by the worker was great. Further, according to PLT 2, each time the color, shape, etc. of the IC device or socket was changed, was necessary to adjust the position, amount, etc. of the light applied to the socket or produce new reference data, so the load of the preparatory work by the worker was again large.

CITATION LIST

Patent Literature

PLT 1: Japanese Patent Publication No. H06-058986A
PLT 2: Japanese Patent Publication No. 2009-145153A

SUMMARY OF INVENTION

Technical Problem

An IC handler able to prevent a doubly stacked state of IC devices without requiring massive preparatory work even if the type of the socket of the test head or IC device under test is changed has been sought.

Solution to Problem

According to one aspect of the present invention, there is provided an IC handler conveying an IC device to a test head for testing IC devices, in which IC handler, the test head is provided with a socket having a placing surface on which the IC device is placed and attaches the IC device placed on the placing surface to the test head, the IC handler is provided with a non-contact displacement meter arranged separated from the socket in a direction vertical to the placing surface, and the non-contact displacement meter fires a beam toward the placing surface to thereby measure a distance from the non-contact displacement meter to the IC device placed on the placing surface.

Advantageous Effects of Invention

According to one aspect of the present invention, it is possible to use the measured distance of a non-contact displacement meter firing a beam toward a placing surface of a socket as the basis to judge the risk of IC devices being doubly stacked. Therefore, according to the present invention, it is possible to prevent the double stacked state state of IC devices without requiring massive preparatory work when a type of socket or IC device is changed.

BRIEF DESCRIPTION OF DRAWINGS

FIG. 1 is a plan view of an IC test system including an IC handler of an embodiment of the present invention.

FIG. 2 is a cross-sectional view along the line II-II of FIG. 1 and shows the operation at the time of a robot arm of an IC handler of the present embodiment inserting IC devices in sockets.

FIG. 3 is a cross-sectional view similar to FIG. 2 and shows the operation when the robot arm of the IC handler of the present embodiment ejects IC devices from sockets.

FIG. 4 is a partially enlarged view of FIG. 1 and shows the state when a displacement measurement unit of the IC handler of the present embodiment is at a storage position.

FIG. 5 is a partially enlarged view similar to FIG. 4 and shows the state where the displacement measurement unit of the IC handler of the present embodiment is present at a measurement position.

FIG. 6 is a cross-sectional view along the line VI-VI of FIG. 5.

DESCRIPTION OF EMBODIMENTS

Figure 7:
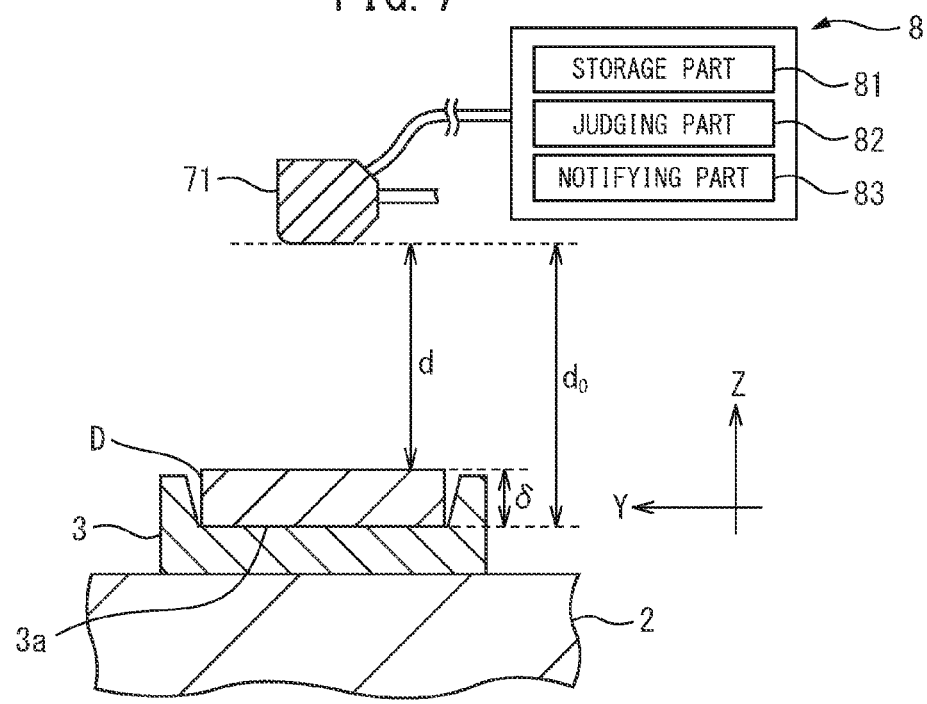
FIG. 7 is a view for explaining processing for judging a double stacked state according to the IC handler of the present embodiment.

Below, embodiments of the present invention will be explained in detail referring to the drawings. In these drawings, similar component elements are assigned similar notations. Note that, the following description does not limit the technical scope or meaning of terms of the inventions described in the claims.

Referring to FIG. 1 to FIG. 8, IC handlers according to embodiments of the present invention will be explained. FIG. 1 is a plan view of an IC test system 1 including a typical IC handler 4 according to the present embodiment. As shown in FIG. 1, the IC test system 1 comprises a table shaped base 10, a test head 2 mounted at the base 10, and a plurality of sockets 3 arranged at the test head 2. The test head 2 performs power-up tests on IC devices inserted at the sockets 3. The individual sockets 3 have placing surfaces 3a on which the IC devices are placed and are designed to attach IC devices placed on the placing surfaces 3a to the test head 2. The structures of the individual sockets 3 are also shown in FIG. 6.

The IC handler 4 of the present embodiment is a conveyor device conveying IC devices for power-up tests by the test head 2 of the IC test system 1. The IC test system 1 according to the example of FIG. 1 is provided with a pair of IC handlers 4, 4. These IC handlers 4, 4 are provided with a pair of shift plates 5, 5 able to move along the top surface of the base 10 in the direction of the arrow A10 and a pair of robot arms 6, 6 arranged above the base 10. Note that, in the example of FIG. 1, the direction parallel to the direction of movement of the shift plates 5, 5 is made the X-direction and the direction perpendicular to the X-direction at the top surface of the base 10 is made the Y-direction (same in other drawings). The test head 2 according to the present example has two lines of sockets 3 side by side in the Y-direction. Each line includes eight sockets 3 arranged in the X-direction. That is, the test head 2 according to the present example has a total of 16 sockets arranged at it. The placing surfaces 3a of these sockets 3 are oriented so as to be parallel in both the X-direction and Y-direction. Note that, between the test head 2 and the sockets 3, a printed circuit board called a "performance board" is arranged. In general, the number and array of the sockets at the test head 2 are determined in accordance with the circuit patterns of the performance board.

In the example of FIG. 1, a pair of IC handlers 4, 4 are arranged symmetrically with each other in the Y-direction so as to straddle the sockets 3. The respective IC handlers 4 are configured similar to each other. For this reason, below, only one IC handler 4 will be explained. In the example of FIG. 1, the shift plate 5 of the IC handler 4 has a loading region 5a and an unloading region 5b arranged aligned in the X-direction and is driven by a not shown drive mechanism to move in the X-direction. Here, the loading region 5a is a region where pre-test IC devices to be inserted at sockets 3 are placed. The pre-test IC devices are placed by a not shown loading robot at the loading region 5a. Further, the unloading region 5b is a region at which tested IC devices ejected from the sockets 3 are placed. The IC devices placed at the unloading region 5b are unloaded by a not shown unloading robot to trays in accordance with the results of the power-up tests.

As shown by the arrow A10 in FIG. 1, the shift plate 5 can move in the X-direction between a loading position where the loading region 5a adjoins the sockets 3 and an unloading position where the unloading region 5b adjoins the sockets 3. In the example of FIG. 1, the shift plate 5 present at the unloading position is shown by the solid line, while the shift plate 5 present at the loading position is shown by the one-dot chain line. The shift plate 5 according to the present example moves from the unloading position to the loading position to thereby convey pre-test IC devices placed at the loading region 5a to near the sockets 3. Further, the pre-test IC devices are inserted by the robot arm 6 of the IC handler 4 into the sockets 3.

In the example of FIG. 1, the robot arm 6 of the IC handler 4 successively performs an operation for inserting pre-test IC devices in the sockets 3 and an operation of ejecting tested IC devices from the sockets 3. FIG. 2 is a cross-sectional view along the line II-II of FIG. 1 and shows the operation when the robot arm 6 is inserting pre-test IC devices into sockets 3. Note that, in FIG. 2, the Z-direction is a direction vertical to both the X-direction and Y-direction of FIG. 1, that is, a direction vertical to the placing surfaces of the sockets 3 (same in other drawings).

In the example of FIG. 2, the robot arm 6 is provided with a contact head 61 pushing the IC devices D against the test head 2 at the time of power-up tests of the IC devices D. The contact head 61 is provided with suction nozzles 62 for picking up and holding the IC devices D. The number and array of the suction nozzles 62 at the contact head 61 correspond to the number and array of the sockets at the test head 2. The robot arm 6 according to the present example moves the contact head 61 in accordance with the following procedure to thereby insert the pre-test IC devices D at the sockets 3. Note that, in the example of FIG. 2, the shift plate 5 is made one moved from the unloading position to the loading position.

First, as shown by the solid line in FIG. 2, when the shift plate 5 is at the loading position, the contact head 61 is made to move in the Y-direction and Z-direction whereby the suction nozzles 62 are made to abut against IC devices D on the loading region 5a. Next, if the suction nozzles 62 pick up and hold the ID devices D, as shown by the arrow A21 of FIG. 2, the contact head 61 is moved in the Z-direction whereby the IC devices D are lifted up from the loading region 5a. Furthermore, as shown by the arrow A22 of FIG. 2, the contact head 61 is moved in the Y-direction whereby the IC devices D are aligned with the sockets 3 in the Y-direction. Next, as shown by the arrow A23 in FIG. 2, the contact head 61 is moved in the Z-direction whereby IC devices D are placed on the placing surfaces 3a of the sockets 3. Due to this, the IC devices D finish being inserted at the sockets 3. The state at this time is shown by the broken line in FIG. 2.

After that, as shown by the arrow A24 in FIG. 2, the contact head 61 is further moved in the Z-direction whereby the IC devices D inside the sockets 3 are pushed against the test head 2. Due to this, the IC devices D inside the sockets 3 are electrically connected to the test head 2 and the power-up tests of the IC devices D are started. In this way, the robot arm 6 according to the present example further performs the operation of pushing the IC devices D inside the sockets 3 against the test head 2. When the power-up tests of the IC devices D are started, the shift plate 5 is moved from the loading position to the unloading position.

FIG. 3 is a cross-sectional view similar to FIG. 2 and shows the operation at the time the robot arm 6 ejects tested IC devices D from sockets 3. The robot arm 6 according to the present example moves the contact head 61 in accordance with the following procedure to eject tested IC devices D from the sockets 3. First, as shown by the solid line of FIG. 3, after the power-up tests of IC devices D inside the sockets 3 end, the suction nozzles 62 again pick up and hold the IC devices in the sockets 3. Next, as shown by the arrow A31 of FIG. 3, the contact head 61 is moved in the Z-direction, whereby the IC devices D are lifted up from the placing surfaces 3a of the sockets 3. Furthermore, as shown in FIG. 3 by the arrow A32, the contact head 61 is moved in the Y-direction, whereby the IC devices D are positioned in the Y-direction with respect to the unloading region 5b. Next, as shown by the arrow A33 of FIG. 3, the contact head 61 is moved in the Z-direction whereby the IC devices D are placed in the unloading region 5b. The state at this time is shown by the broken line of FIG. 3. Further, the suction states of the suction nozzles 62 are released, whereby the operation of ejection of the IC devices D from the sockets 3 is completed. The series of steps shown in FIG. 2 and FIG. 3 will sometimes be referred to below as the "insertion and ejection process" of IC devices.

Note that, for simplification of the explanation, FIG. 2 and FIG. 3 show the shift plate 5 and robot arm 6 of only one IC handler 4. The shift plate 5 and robot arm 6 of the other IC handler 4 can operate in the same way as these. That is, the shift plates 5, 5 and robot arms 6, 6 of the pair of IC handlers 4, 4 can alternately perform the above-mentioned insertion and ejection process. Due to this, the frequency of replacement of IC devices at the sockets 3 is increased, so the operating rate of the test head 2 can be improved.

Referring to FIG. 1 to FIG. 3, the IC handler 4 according to the present example is provided with a displacement measurement unit 7 inserted at the bottom surface of the shift plate 5 so as to move together with the shift plate 5 in the X-direction. The displacement measurement unit 7 has a non-contact displacement meter 71. It fires a beam toward the measured object to measure the distance from the non-contact displacement meter 71 to the measured object. The non-contact displacement meter 71 can be, for example, a laser displacement meter firing a laser beam, an ultrasonic displacement meter firing an ultrasonic beam, etc. FIG. 4 is a partially enlarged view showing the vicinity of the displacement measurement unit 7 at the IC handler 4 of FIG. 1. The displacement measurement unit 7 according to the example of FIG. 4 is provided with a non-contact displacement meter 71 comprised of a laser displacement meter, a support rod 72 supporting a non-contact displacement meter 71, an L-shaped link member 73 making the non-contact displacement meter 71 supported by the support rod 72 move relative to the shift plate 5, and an air cylinder 74 fastened to the bottom surface of the shift plate 5 so as to operate the link member 73.

The support rod 72 according to the example of FIG. 4 supports the non-contact displacement meter 71 at one end part 72a. The support rod 72 is attached to the shift plate 5 to be able to slide in the Y-direction by a guide member 5c fastened to the bottom surface of the shift plate 5. At one end part 72b of the support rod 72, a Z-direction pin hole in which a first joint pin 75 is inserted is formed. Further, the link member 73 according to the present example has a first extended part 731 extending in the longitudinal direction of the link member 73 and a second extended part 732 extending from one end part 731a of the first extended part 731 generally vertically to the first extended part 731. The link member 73 is attached to the shift plate 6 positioned at the end part 731a to be able to rotate about the Z-direction axis of rotation R. Further, at the other end part 731b of the first extended part 731, a Z-direction pin hole in which a first joint pin 75 is inserted is formed. That is, the end part 72b of the support rod 72 and the end part 731b of the first extended part 731 are connected by the first joint pin 75 to be able to rotate about the axis of rotation in the Z-direction. Further, at the other end part 732b of the second extended part 732, a Z-direction pin hole in which a second joint pin 76 is inserted is formed.

Further, the air cylinder 74 according to the present example is provided with a cylinder tube 741 for generating the energy of compressed air, a piston rod 742 moving linearly in the X-direction by the energy of the compressed air, and an operating member 743 attached to the front end part of the piston rod 742. The operating member 743 is formed with a Z-direction pin hole in which a second joint pin 76 is inserted. The end part 732b of the second extended part 732 and the operating member 743 are coupled to be able to rotate about the Z-direction axis of rotation by the second joint pin 76. Further, the operating member 743 is designed to move back and forth between a back position in proximity to the cylinder tube 741 and a front position separated from the cylinder tube 741. FIG. 4 shows an operating member 743 present at a back position. By the above structured support rod 72, link member 73, and air cylinder 74 being coupled, the back and forth motion of the operating member 743 in the X-direction is converted into back and forth motion of the non-contact displacement meter 71 in the Y-direction through the link member 73 rotating about the axis of rotation R. Due to this, the displacement measurement unit 7 according to the present example can move in the Y-direction between the storage position corresponding to the back position of the operating member 743 (see FIG. 4) and the measurement position corresponding to the front position of the operating member 743. The displacement measurement unit 7 present at a storage position such as FIG. 4 will never interfere with the robot arm 6 performing the above-mentioned insertion and ejection process.

FIG. 5 is a partially enlarged view similar to FIG. 4 and shows the displacement measurement unit 7 at the measurement position. Further, FIG. 6 is a cross-sectional view along the line VI-VI of FIG. 5. If, as in FIG. 5 and FIG. 6, the displacement measurement unit 7 is moved to the measurement position, the non-contact displacement meter 71 is aligned with the sockets 3 in the Y-direction and is arranged separated from the sockets 3 in the Z-direction. Therefore, the non-contact displacement meter 71 present at the measurement position can fire a laser beam toward the placing surface of a socket 3 to thereby measure the distance up to the measured object present in the direction of progression of the beam. The distance measured in this way will be referred to below as the "measured distance 'd'". Further, the non-contact displacement meter 71 present at the measurement position can move in the X-direction together with the shift plate 5 to thereby measure the measured distance "d" at a plurality of measurement points in the socket 3.

The IC handler 4 according to the present embodiment performs processing for judging the risk of IC devices D being in a double stacked state based on the measured distance "d" of the non-contact displacement meter 71. This processing will be referred to below as "processing for judging the double stacked state". Here, referring again to FIG. 1, the IC handler 4 of the present embodiment is provided with a control unit 8 controlling the operations of the different parts of the IC handler 4 and performing various processing operations. In particular, the control unit according to the present example is provided with a storage part 81 storing various data, a judging part 82 performing processing for judging the above double stacked state, and a notifying part 83 for sending various messages to a worker.

Next, referring to FIG. 7, the processing for judging a double stacked state by the judging part 82 of the control unit 8 will be explained. FIG. 7 is a cross-sectional view similar to FIG. 6 showing the vicinity of the non-contact displacement meter 71 present at a measurement position and a socket 3. In the processing for judging a double stacked state, the judging part 82 first acquires the measured distance "d" for a plurality of measurement points in the socket 3 from the non-contact displacement meter 71. Next, the judging part 82 acquires the distance from the non-contact displacement meter 71 to the placing surface 3*a* of the socket 3 from the storage part 81. This distance will sometimes be referred to as the "reference distance $d_0$" below. The reference distance $d_0$ can be measured in advance by the non-contact displacement meter 71 and stored in storage part 81. The reference distance $d_0$ can also be measured for a plurality of measurement points in the same way as the measured distance "d". Next, the judging part 82 calculates the difference $\delta$ ($\delta = d_0 - d$) between the reference distance $d_0$ and the measured distance "d" for all measurement points. As will be understood from FIG. 7, when there is an IC device D or other measured object in a socket 3, this difference $\delta$ expresses the Z-direction thickness of the measured object.

Figure 8:
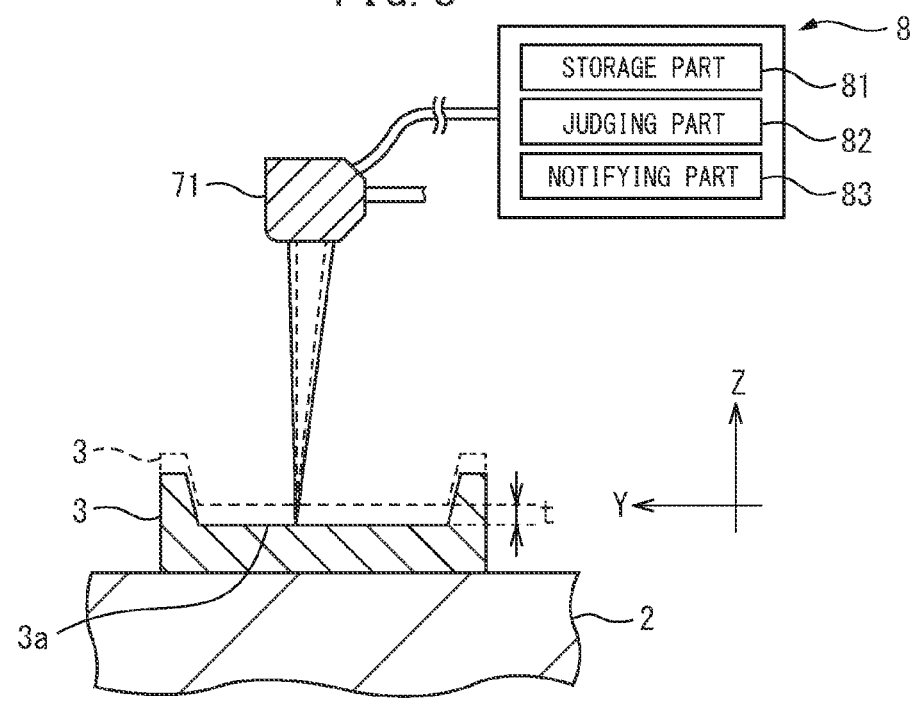
FIG. 8 is a view for explaining a threshold value used for processing for judging a double stacked state according to the IC handler of the present embodiment.

Next, the judging part 82 acquires a threshold value "t" for the processing for judgment of a double stacked state from the storage part 81. This threshold value "t" is set in advance by the worker and can be stored in the storage part 81. Referring to FIG. 8, one example of the threshold value "t" will be explained. FIG. 8 is a cross-sectional view similar to FIG. 6 and FIG. 7 showing the vicinity of the non-contact displacement meter 71 present at a measurement position and a socket 3. The threshold value "t" according to the present example shows the maximum allowable value of the amount of fluctuation of the distance from the non-contact displacement meter 71 present at the measurement position to the placing surface 3*a*. Such fluctuation of the distance can occur, for example, due to the repeated operations of the parts of the IC handler 4 and the heat deformation of the parts accompanying a high temperature test etc. Therefore, the threshold value "t" according to the present example can be determined based on the precision of repetition of the moving parts of the shift plate 5 and displacement measurement unit 7, the deformation of a socket 3, shift plate 5, and displacement measurement unit 7 accompanying a high temperature test, etc.

Referring again to FIG. 7, the judging part 82 compares the difference $\delta$ calculated based on the measurement points and the threshold value "t". Next, the judging part 82 calculates the ratio of measurement points with a difference $\delta$ larger than the threshold value "t" (that is, measurement points where $\delta > t$) in all measurement points. The measurement points with a difference $\delta$ larger than the threshold value "t" will be referred to below as "abnormal measurement points". Next, the judging part 82 judges if the ratio of abnormal measurement points exceeds a certain level. The "certain level" referred to here is, for example, 75% of all measurement points. Further, when the ratio of abnormal measurement points exceeds a certain level, the judging part 82 judges that the state inside the socket 3 is abnormal. That is, the judging part 82 judges there is the possibility of two or more IC devices D being inserted stacked in the socket 3 since at least one IC device D is already inserted in the socket 3. In this case, the notifying part 83 of the control unit 8 sends a worker a warning message. On the other hand, when the ratio of abnormal measurement points does not exceed a certain level, the judging part 82 judges that the state inside the socket 3 is normal. That is, the judging part 82 judges there is no possibility of two or more IC devices being inserted stacked in the socket 3 since there is no IC device D in the socket 3.

Referring again to FIG. 5, the non-contact displacement meter 71 according to the present example is supported by the support rod 72 so as to move in the X-direction together with the shift plate 5. For this reason, if the shift plate 5 is moved from the unloading position to the loading position, the non-contact displacement meter 71 is moved in the direction shown by the arrow A50 of FIG. 5. As a result, the non-contact displacement meter 71 can successively fire a laser beam toward the placing surfaces 3*a* of the eight sockets 3 arranged in the X-direction so as to measure the distances up to the IC devices D inserted in these sockets 3. Therefore, the IC handler 4 according to the present example can perform the processing for judging the double stacked state for the plurality of sockets 3 arranged in the X-direction by one non-contact displacement meter 71. Further, the non-contact displacement meter 71 is moved by the drive mechanism of the shift plate 5 in the X-direction, so there is no need to mount a separate drive mechanism for making the non-contact displacement meter 71 move in the IC test system 1.

Note that, in the IC handler 4 according to the present example, while the robot arm 6 is performing the insertion and ejection process of IC devices D, the displacement measurement unit 7 can be held at a storage position such as in FIG. 4. On the other hand, when the insertion and ejection process of IC devices D is stopped due to some short of reason, the displacement measurement unit 7 is moved to a measurement position such as shown in FIG. 5 and processing for judging a double stacked state by the judging part 82 can be started. Therefore, according to the IC handler 4 of the present example, before the once stopped insertion and ejection process of IC devices D is restarted, the risk of a double stacked state of IC devices D can be judged, so it is possible to reliably prevent a double stacked state of the IC devices D. Note that, the insertion and ejection process of IC devices can be automatically stopped when sensors provided at different parts of the IC test system 1 detect some sort of abnormality and can be manually stopped by a worker for inspection of the test head 2 or sockets 3 etc.

In the above way, according to the IC handler 4 of the present embodiment, processing for judgment of a double stacked state of IC devices can be performed based on the measured distance "d" of the non-contact displacement meter 71 firing a laser beam toward a placing surface of a socket 3. Therefore, according to the IC handler 4 of the present embodiment, even if the type of the socket 3 or IC device D is changed, it is possible to judge the risk of a double stacked state of the IC devices D by just storing a new reference distance $d_0$ or threshold value "t" in the storage part 81. As a result, according to the IC handler 4 of the present embodiment, the massive preparatory work when the type of the socket 3 or IC device D is changed becomes unnecessary. Further, in general, a laser displacement meter has a micron unit resolution, so according to the IC handler 4 of the present embodiment, even when a thin IC device with a thickness of less than 0.5 mm is tested, it becomes possible to accurately judge the risk of a double stacked state of IC devices D. Due to this, a double stacked state of IC devices D can be reliably prevented.

The present invention is not limited to only the above embodiments and can be modified in various ways within the scope described in the claims. Further, the dimensions, shapes, material quality, etc. of the above-mentioned parts are just illustrations. Various dimensions, shapes, material qualities, etc. may be employed for achieving the advantageous effects of the present invention.

REFERENCE SIGNS LIST

1 IC test system
10 base
2 test head
3 socket
3a placing surface
4 IC handler
5 shift plate
5a loading region
5b unloading region
5c guide member
6 robot arm
61 contact head
62 suction nozzle
7 displacement measurement unit
71 non-contact displacement meter
72 support rod
73 link member
731 first extended part
732 second extended part
74 air cylinder
741 cylinder tube
742 piston rod
743 operating member
75 first joint pin
76 second joint pin
8 control unit
81 storage part
82 judging part
83 notifying part
d measured distance
$d_0$ reference distance
D IC device
δ difference
t threshold value

The invention claimed is:

1. An integrated circuit (IC) handler configured to convey an IC device to a test head having a socket including a placing surface on which the IC device is placed, the IC handler comprising:
a shift plate configured to move while carrying a plurality of IC devices,
a robot arm configured to hold the IC device carried by the shift plate and configured to place the IC device on the socket, and
a measurement unit attached to the shift plate,
the measurement unit comprising:
a non-contact displacement meter, and
an actuator configured to maneuver the non-contact displacement meter between a storage position where the non-contact displacement meter does not interfere with the robot arm maneuvering the IC device and a measurement position where the non-contact displacement meter is spaced from the socket in a direction vertical to said placing surface,
wherein said non-contact displacement meter fires a beam toward said placing surface at the measurement position to thereby measure a distance from said non-contact displacement meter to either the placing surface or the IC device placed on the placing surface.

2. The IC handler according to claim 1, wherein:
a plurality of sockets are arranged at said test head along a first direction, and
said non-contact displacement meter is configured to move parallel to said first direction so as to successively fire a beam toward placing surfaces of said plurality of sockets.

3. The IC handler according to claim 2, wherein the shift plate moves parallel to the first direction, and
wherein said non-contact displacement meter moves parallel to said first direction together with said shift plate.

4. The IC handler according to claim 1, further comprising a judging part using a distance measured by said non-contact displacement meter as the basis to judge if there is a possibility of two or more of said IC devices being placed at said placing surface.

5. The IC handler according to claim 1, wherein said non-contact displacement meter is a laser displacement meter firing a laser beam.

* * * * *